United States Patent
Jenq et al.

[11] Patent Number: 6,133,113
[45] Date of Patent: Oct. 17, 2000

[54] METHOD OF MANUFACTURING SHALLOW TRENCH ISOLATION

[75] Inventors: J.S. Jason Jenq, Pingtung; Jau-Huang Ho, Hsinchu Hsien, both of Taiwan

[73] Assignee: United Microelectronics Corp., Hsinchu, Taiwan

[21] Appl. No.: 09/098,117

[22] Filed: Jun. 16, 1998

[30] Foreign Application Priority Data

Apr. 27, 1998 [TW] Taiwan ................... 87106434

[51] Int. Cl.⁷ .................................. H01L 21/76
[52] U.S. Cl. .................. 438/424; 438/425; 438/435; 438/446; 438/782
[58] Field of Search ................. 438/424, 425, 438/426, 427, 435, 428, 433, 782, 438, 446; 257/510, 513, 519, 647, 374

[56] References Cited

U.S. PATENT DOCUMENTS

| | | | |
|---|---|---|---|
| 5,506,168 | 4/1996 | Morita et al. | 438/424 |
| 5,801,082 | 9/1998 | Tseng | 438/424 |
| 5,882,983 | 3/1999 | Gardner et al. | 438/424 |
| 5,918,131 | 6/1999 | Hsu et al. | 438/296 |
| 5,960,297 | 9/1999 | Saki | 438/424 |
| 6,005,279 | 12/1999 | Luning | 257/510 |

*Primary Examiner*—Carl Whitehead, Jr.
*Assistant Examiner*—Khanh Duong
*Attorney, Agent, or Firm*—Thomas, Kayden, Horstemeyer & Risley

[57] ABSTRACT

A method of manufacturing shallow trench isolation comprising the steps of forming a pad oxide layer and a mask layer over a substrate, then patterning the pad oxide layer and the mask layer forming an opening in the substrate. Thereafter, insulating material is deposited into the opening forming an insulating layer, and then the mask layer is removed to expose the pad oxide layer. Next, insulating spacers are formed on the sidewalls of the insulating layer. Subsequently, the insulating spacers and the pad oxide layer are removed to complete the formation of shallow trench isolation. Hence, a trench-filled insulating layer having a smooth upper surface is formed. By forming insulating spacers over the junction area between the substrate and the insulating layer, over-etching of the junction is avoided.

8 Claims, 3 Drawing Sheets

METHOD OF MANUFACTURING SHALLOW TRENCH ISOLATION

CROSS-REFERENCE TO RELATED APPLICATION

This application claims the priority benefit of Taiwan application serial no. 87106434, filed Apr. 27, 1998, the full disclosure of which is incorporated herein by reference.

BACKGROUND OF THE INVENTION

1. Field of Invention

The present invention relates to a method of manufacturing a device isolating structure. More particularly, the present invention relates to a method of manufacturing shallow trench isolation.

2. Description of Related Art

An integrated circuit is made from a combination of various device types and isolating structures. Devices are separated from each other by the isolating structures. The most commonly used device isolating structures include shallow trench isolation (STI). FIGS. 1A through 1D are cross-sectional views showing the progression of manufacturing steps in fabricating shallow trench isolation using a conventional method. First, as shown in FIG. 1A, a pad oxide layer 11 is grown over a substrate 10 using, for example, a thermal oxidation method. Then, a chemical vapor deposition (CVD) method is used to form a silicon nitride layer 12 over the pad oxide layer 11. Next, as shown in FIG. 1B, photolithographic and etching techniques are used to pattern the pad oxide layer 11, the silicon nitride layer 12 and the substrate 10. For example, a dry etching method can be used to pattern the pad oxide layer 11 and the silicon nitride layer 12, and to form an opening 13 in the substrate 10 that functions as an STI trench. Thereafter, a liner oxide layer 14 is formed on the bottom and the sidewalls of the opening 13, and then a CVD method is used to deposit oxide into the trench 13 forming an oxide layer 15. Subsequently, as shown in FIG. 1C, the oxide layer 15 is polished using a chemical-mechanical polishing (CMP) method or etch-back method using the silicon nitride layer 12a as an etching or polishing stop layer. Thereafter, the silicon nitride layer 12a is exposed. Finally, as shown in FIG. 1D, the silicon nitride layer 12a is removed to expose the oxide layer 15a. Then, a gate oxide layer 16 is formed over the substrate 10 followed by subsequent processing operations necessary for the fabrication of complete devices.

In the aforementioned method of fabricating shallow trench isolation, a wet etching method is used to remove the pad oxide layer 11a, in which method hydrofluoric acid is used as an etchant for carrying out the etching operation. Since wet etching is an isotropic etching method, oxide layer 15a surface adjacent to the substrate 10 can be easily over-etched due to the corrosiveness of hydrofluoric acid. One consequence of this is that recesses 17 are formed on the surface of the oxide layer 15a adjacent to the substrate 10.

The formation of recesses 17 will lead to the formation of sharp corners 18 at the junction between the oxide layer 15a and the substrate 10. Therefore, when a gate oxide layer 16 is subsequently deposited over the substrate 10 and oxide layer 15a, a thin layer of gate oxide will be formed over the sharp corner areas 18. Consequently, after the gate is formed, if a voltage is applied to the gate terminal, leakage current can flow from the sharp corner areas 18.

Furthermore, when fabrication of the semiconductor device is finished, the recesses formed between the substrate and oxide layer due to over-etching will tend to accumulate electric charges, which can lower the threshold voltage of the device. This will lead to the generation of abnormal sub-threshold current, known also as the "kink effect". Low threshold voltage combined with abnormal sub-threshold current will lower the quality of the device leading to a reduction in product yield, which is highly undesirable.

To reduce leakage current due to sharp corners, conventional methods rely on minimizing the use of wet etching or reducing the wet etching time. Alternatively, an additional layer of material is deposited over the sharp corner area to smooth out the area. However, these methods are not very efficient.

In light of the foregoing, there is a need to provide an improved method of manufacturing shallow trench isolation.

SUMMARY OF THE INVENTION

Accordingly, the present invention is to provide a method of smoothing out the sharp corner areas between an insulating oxide layer and adjacent substrate so that leakage current can be reduced and hence reliability of the device can be increased. The method of smoothing out sharp corner areas includes forming a spacer, wherein the spacer is made from a material similar in properties to the insulating oxide layer. Therefore, after the isolating structure is formed, the spacer and the insulating oxide layer above the substrate can be removed simultaneously to obtain a smooth continuous surface between the insulating layer and the adjacent substrate.

To achieve these and other advantages and in accordance with the purpose of the invention, as embodied and broadly described herein, the invention provides a method of manufacturing shallow trench isolation. The method comprises the steps of forming a pad oxide layer and a mask layer over a substrate, then patterning the pad oxide layer and the mask layer to form an opening in the substrate. The opening in the substrate acts as a trench of the isolating structure. Thereafter, insulating material is deposited into the opening to form an insulating layer, and then the mask layer is removed to expose the pad oxide layer. Next, insulating spacers are formed on the sidewalls of the insulating layer. Subsequently, the insulating spacers and the pad oxide layer are removed to complete the fabrication of the STI structure. Therefore, an insulator-filled opening having a smooth upper surface is obtained.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
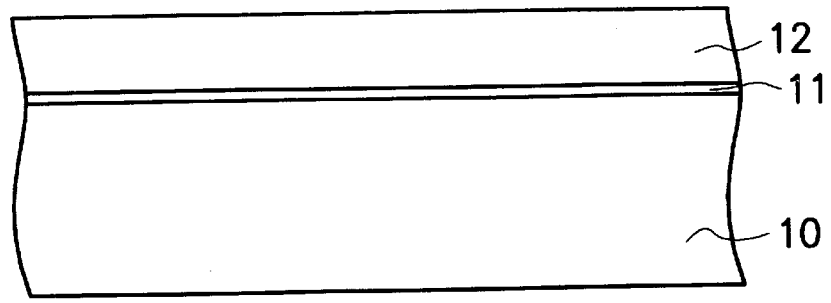
FIGS. 1A through 1D are cross-sectional views showing the progression of manufacturing steps in fabricating shallow trench isolation using a conventional method.
Figure 1B:
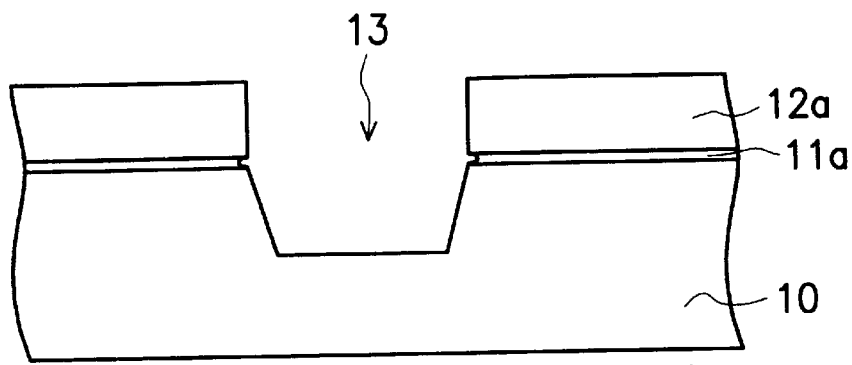
Figure 1C:
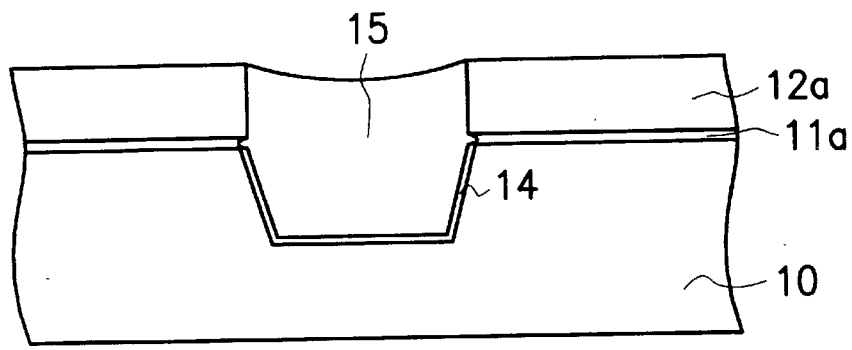
Figure 1D:
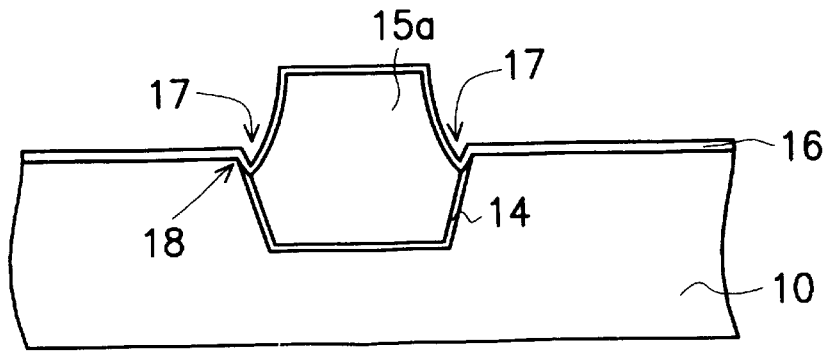

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2F are cross-sectional views showing the progression of manufacturing steps in fabricating shallow trench isolation (STI) according to one preferred embodiment of this invention.

Figure 2A:
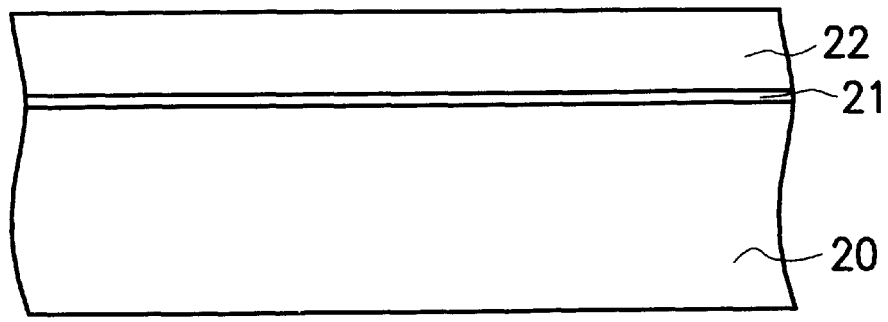
FIGS. 2A through 2F are cross-sectional views showing the progression of manufacturing steps in fabricating shallow trench isolation according to one preferred embodiment of this invention.

First, as shown in FIG. 2A, a pad oxide layer 21, preferably having a thickness of about 250 Å, is formed over a substrate 20 using, for example, a thermal oxidation method. Then, a mask layer 22, preferably having a thickness of about 2400 Å, is formed over the pad oxide layer 21. The mask layer 22 can be a silicon nitride layer formed by a low-pressure chemical vapor deposition (LPCVD) method, for example.

Figure 2B:
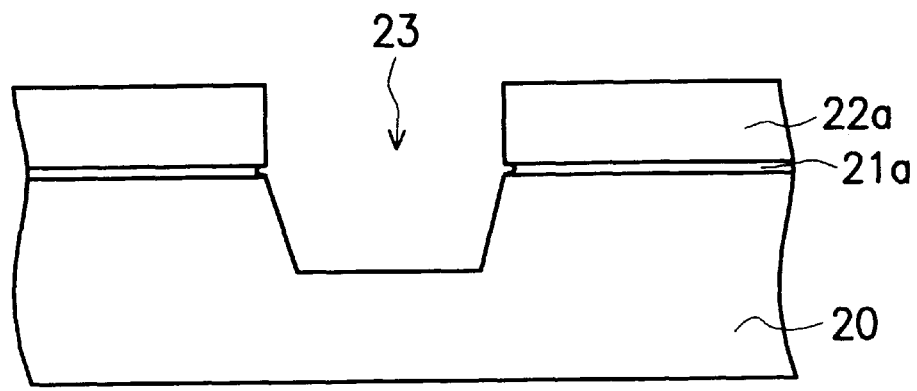

Next, as shown in FIG. 2B, photolithographic and etching techniques are used to pattern the mask layer 22 and the pad oxide layer 21, and finally to form an opening 23 in the substrate 20. The opening 23 serves as a trench for the STI structure. The opening 23 can be formed by plasma-etching the mask layer, the pad oxide layer 21 and the substrate 20 in sequence using a mixture of different gases, for example. Ultimately, a mask layer 22a, a pad oxide layer 21a and the opening 23 in the substrate 20 are formed.

Figure 2C:
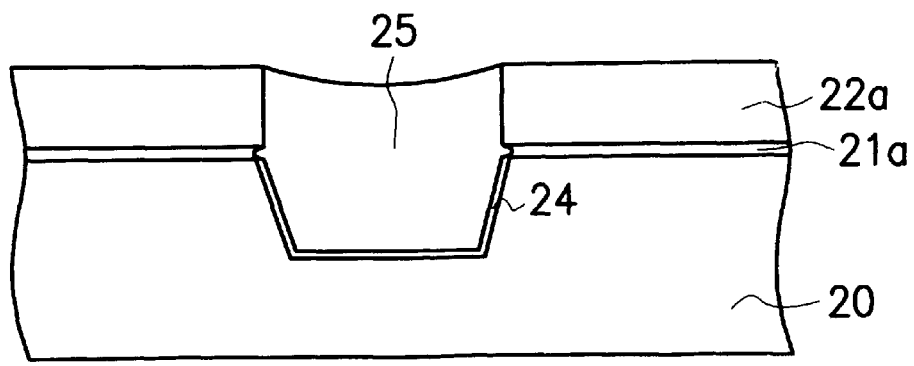

Thereafter, as shown in FIG. 2C, a liner oxide layer 24, preferably having a thickness of about 300 Å, is formed on the surface of the opening 23 using, for example, a thermal oxidation method. Next, a thick insulating layer 25 is deposited over the mask layer 22a, completely filling the opening 23. For example, the insulating layer 25 can be an oxide layer formed using ozone/tetra-ethyl-ortho-silicate (TEOS) or TEOS as reactive gases in a chemical vapor deposition (CVD) process. Alternatively, a high-quality high-density oxide layer having a thickness of about 7000Å can be formed using a high-density plasma chemical vapor deposition (HDPCVD) method. Thereafter, the insulating layer 25 is planarized using, for example, a chemical-mechanical polishing (CMP) method. Subsequently, a portion of the insulating layer above the mask layer 22a is removed to expose surface of the mask layer 22a. In general, when a CMP operation is carried out, a hard material layer should be used as a polishing stop layer. Since a silicon nitride layer has good polishing resistance and stability, the silicon nitride layer 22a is a suitable polishing stop layer in the CMP operation.

Figure 2D:
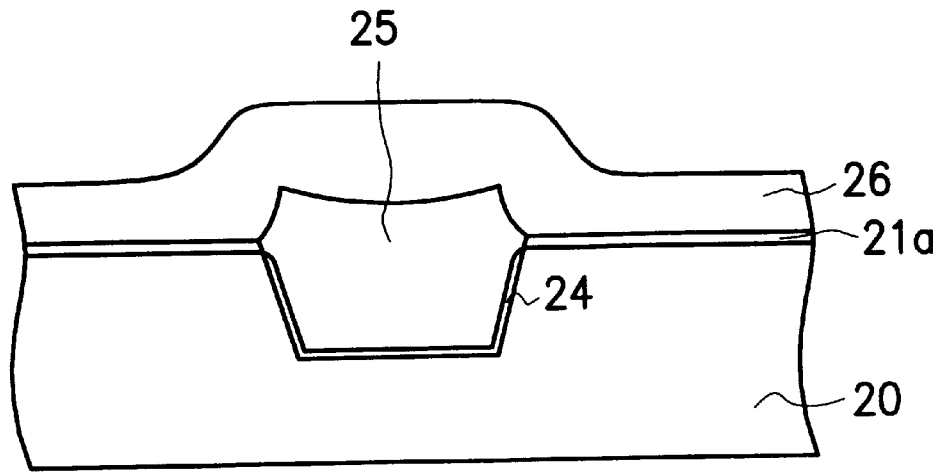

Next, as shown in FIG. 2D, the mask layer 22a is removed. If the mask layer 22a is made from silicon nitride, the mask layer 22a can be removed by a wet etching method using hot phosphoric acid ($H_3PO_4$). Thereafter, another insulating layer 26 is formed over the substrate 20 and the insulating layer 25. For example, the insulating layer 26 can be a silicon oxynitride ($SiO_xN_y$) having a thickness of about 1000 Å.

Figure 2E:
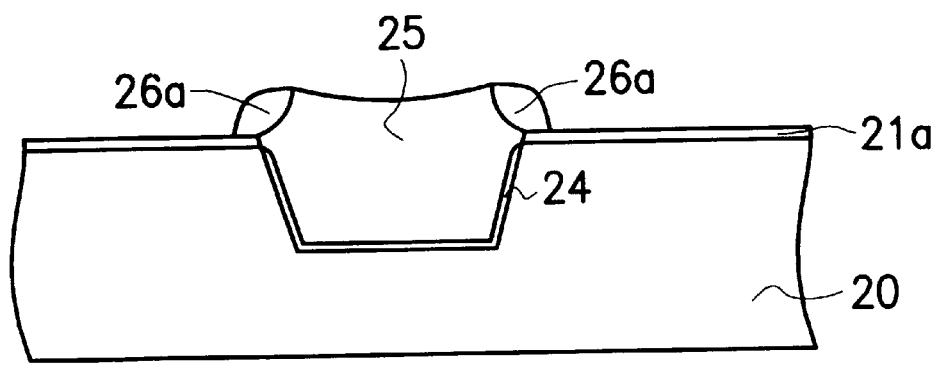

Next, as shown in FIG. 2E, the insulating layer 26 is etched back using, for example, a dry etching method. The insulating layer 26 is etched until the pad oxide layer 21a is exposed, thereby forming insulating spacers 26a on the sides of the insulating layer 25.

Figure 2F:
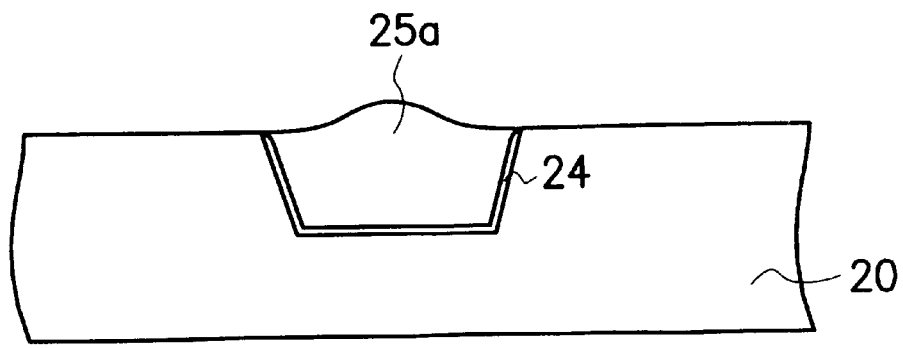

Next, as shown in FIG. 2F, the pad oxide layer 21a is removed. For example, the pad oxide layer 21a can be removed using hydrofluoric acid as the etchant in a wet etching operation. Since the spacers 26a are formed from material having properties very similar to an oxide layer, the spacers 26a will also be removed as the pad oxide layer 21a is etched away. The spacers 26a here function as sacrificial layers. Because the spacers 26a have an etching rate slower than the oxide layer, the spacers 26a can act as a protective layer preventing the over-etching of the junction area where the substrate 20 and the insulating layer 25a meets. Furthermore, the spacers 26a have the capacity to smooth out the conventional sharp corners in the junction area as well. Subsequently, if portions of the spacers 26a remain when the pad oxide layer 21a is completely removed, the residual spacers can be removed again using hot phosphoric acid in a wet etching operation.

In FIG. 2E, the material for forming the insulating spacers 26a must have properties very similar to the oxide layer. In other words, both the spacers 26a and the pad oxide layer 21a must be capable of being etched by the same etchant. For example, one such material is silicon oxynitride, which has properties intermediate between silicon dioxide and silicon nitride. Silicon oxynitride has internal stresses lower than silicon nitride, yet its moisture resistance and impurities blocking power are much greater than those of silicon dioxide are. Therefore, silicon oxynitride is an ideal passivation material. Most silicon oxynitride layers are formed by a plasma-enhanced chemical vapor deposition (PECVD) method with $SiH_4$, $N_2O$ and $N_2$ as the reactants.

In summary, by forming insulating spacers over the junction area between the substrate and the insulating trench material, the junction area is protected from overetching. Moreover, sharp corners at the junction area are also smoothed out by the spacers. Hence, current leakage can be reduced and abnormal sub-threshold current can be minimized.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing shallow trench isolation structure, comprising the steps of:

providing a substrate;

forming a pad oxide layer and a mask layer over the substrate;

patterning the mask layer, the pad oxide layer and the substrate to form an opening in the substrate;

depositing insulating material into the opening, forming an insulating layer over the mask layer and completely filling the opening;

removing the mask layer so that a portion of the insulating layer protrudes above the substrate surface;

forming an insulating material layer over the substrate, wherein the insulating material layer possesses etched properties the same as the insulating layer;

etching back the insulating material layer until the pad oxide layer is exposed to form insulating spacers on the sidewall of the protruded insulating layer; and removing the insulating spacers and the pad oxide layer, simultaneously, so that the insulating layer now has a smooth upper surface.

2. The method of claim 1, wherein the step of removing the insulating spacers and a portion of the insulating layer and the step of removing the pad oxide layer are both conducted at the same time.

3. The method of claim 2, wherein the insulating spacers have a removal rate slower than that of the pad oxide layer and the insulating layer.

4. The method of claim 1, wherein the step of removing the pad oxide layer, the insulating spacers and a portion of the insulating layer includes using hydrofluoric acid (HF).

5. The method of claim 1, wherein the step of forming the insulating layer includes depositing oxide material.

6. The method of claim 1, wherein the step of forming the insulating spacers includes depositing silicon oxynitride ($SiO_xN_y$).

7. The method of claim 1, wherein the step of forming the mask layer includes depositing silicon nitride.

8. The method of claim 1, wherein before the step of forming the insulating layer over the mask layer and into the opening, further includes depositing a liner oxide layer over the bottom and side surfaces of the opening.

* * * * *